(12) United States Patent
Fedigan et al.

(10) Patent No.: US 10,447,186 B2
(45) Date of Patent: *Oct. 15, 2019

(54) LINEAR HALL DEVICE BASED FIELD ORIENTED CONTROL MOTOR DRIVE SYSTEM

(71) Applicant: TEXAS INSTRUMENTS INCORPORATED, Dallas, TX (US)

(72) Inventors: Stephen John Fedigan, Plano, TX (US); Anuj Jain, Lewisville, TX (US); David Patrick Magee, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/615,951

(22) Filed: Jun. 7, 2017

(65) Prior Publication Data

US 2017/0272011 A1    Sep. 21, 2017

Related U.S. Application Data

(63) Continuation of application No. 14/960,164, filed on Dec. 4, 2015, now Pat. No. 9,705,436.

(51) Int. Cl.
*H02K 29/08* (2006.01)
*H02P 6/16* (2016.01)
(Continued)

(52) U.S. Cl.
CPC ............. *H02P 6/16* (2013.01); *G01R 33/072* (2013.01); *G01R 33/077* (2013.01); *H02K 29/08* (2013.01); *H02P 21/06* (2013.01); *H02P 25/03* (2016.02)

(58) Field of Classification Search
CPC .......... H02P 25/06; H02P 6/16; H02K 11/215; G01R 33/07
See application file for complete search history.

(56) References Cited

U.S. PATENT DOCUMENTS 5,493,187 A    2/1996  Iijima
7,211,984 B2   5/2007  Patel et al.
(Continued)

FOREIGN PATENT DOCUMENTS

RU    2188494    8/2002
RU     118483    7/2012

OTHER PUBLICATIONS

Brett Novak and Bibal Akin, "Designing High-Performance and Power-Efficient Motor Control Systems", Texas Instruments, White Paper, Jun. 2009, pp. 1-10.
(Continued)

*Primary Examiner* — Karen Masih
(74) *Attorney, Agent, or Firm* — Michael A. Davis, Jr.; Charles A. Brill; Frank D. Cimino

(57) ABSTRACT

A motor control system for a permanent magnet synchronous motor (PMSM) uses two linear Hall devices to produce a first signal indicative of a strength of a first magnetic field component produced by a set of rotor magnets and to simultaneously produce a second signal indicative of a strength of second magnetic field component produced by the rotor magnets that is approximately orthogonal to the first magnetic field component. An angular position and angular velocity of the rotor is calculated based on the first signal and the second signal. A plurality of phase signals is produced based on the calculated angular position and angular velocity. Current in a plurality of field windings of the motor is controlled using the plurality of phase signals.

8 Claims, 10 Drawing Sheets

(51) Int. Cl.
  *H02P 21/06* (2016.01)
  *G01R 33/07* (2006.01)
  *H02P 25/03* (2016.01)

(56) References Cited

U.S. PATENT DOCUMENTS

| | | | |
|---|---|---|---|
| 7,714,529 B2 | 5/2010 | Chen et al. | |
| 8,193,748 B2 | 6/2012 | Deller et al. | |
| 8,552,721 B2* | 10/2013 | Peev | G01R 33/0005 324/207.2 |
| 8,664,901 B2 | 3/2014 | Perisic et al. | |
| 9,175,982 B2* | 11/2015 | Suk | H02P 6/17 |
| 9,321,172 B2* | 4/2016 | Johnson | B25J 9/08 |
| 2002/0021124 A1 | 2/2002 | Schott et al. | |
| 2004/0217756 A1* | 11/2004 | Johnson | G01R 33/07 324/202 |
| 2007/0176568 A1 | 8/2007 | Robichaux et al. | |
| 2014/0203746 A1 | 7/2014 | Linder | |

OTHER PUBLICATIONS

"Brushless DC Electric Motor", Wikipedia, available at https://en.wikipedia.org/wiki/Brushless_DC_electric_motor on Nov. 18, 2015, pp. 1-7.

"Clarke & Park Transforms on the TMS320C2xx", Application Report Literature No. BPRA048, Texas Instruments, 1997, pp. 1-46.

"Patrick Carner", "Increased Integration, Improved Feature Sets and New Software for Motor Control Systems: C2000 Piccolo F2805x Microcontrollers", Texas Instruments, White Paper, Nov. 2012, pp. 1-9.

Alex Simpkins and Emanuel Todorov, "Position Estimation and Control of Compact BLDG Motors Based on Analog Linear Hall Effect Sensors", WeC11.3, 2010 American Control Conference, Baltimore, MD, Jun. 30-Jul. 2, 2010, pp. 1-8.

Vincent Hiligsmann and Peter Riendeau, "Monolithic 360 Degrees Rotary Position Sensor IC", 2004 Proceedings of IEEE Sensors, Oct. 24-27, 2004, pp. 1137-1142, vol. 3.

F. Caricchi et al, "Sinusoidal Brushless Drive with Low-Cost Linear Hall Effect Position Sensors", 2001 IEEE 32 Annual Power Electronics Specialists Conference, 2001, Jun. 17-21, 2001, Vancouver, BC, pp. 799-804, vol. 2.

Michael Delbaere and Didier Frachon, "Magnetic Resolver—A Design-to-Cost Alternative to Conventional Variable Reluctance Resolvers for the Electric Drives Control", SAE Technical Paper, 2014-01-1694, Apr. 4, 2014, pp. 1-7.

"MLX90316 Rotary Position Sensor IC", Melexis, 3901090316, Rev, 10, Jul. 2013, pp. 1-45.

Sungyoon Jung, Beomseok Lee and Kwanghee Nam, "PMSM Control based on Edge Field Measurements by Hall Sensors", 2010 Twenty-Fifth Annual IEEE Applied Power Electronics Conference and Exposition (APEC), Feb. 21-25, 2010, Palm Springs, CA, pp. 2002-2006.

PCT International Search Report in corresponding PCT Application No. PCT/US2016/064975, dated Mar. 23, 2017 (2 pages).

Extended European Search Report for 16871720.5 dated Oct. 31, 2018.

* cited by examiner

HORIZONTAL ELEMENT

VERTICAL ELEMENT

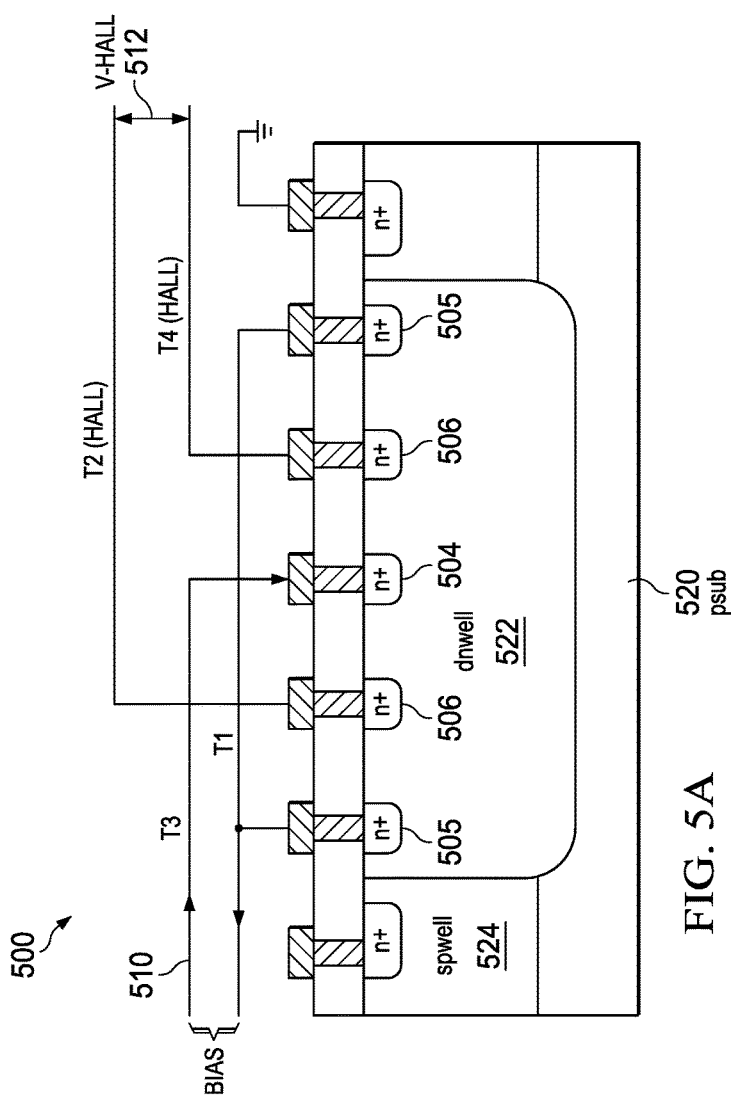
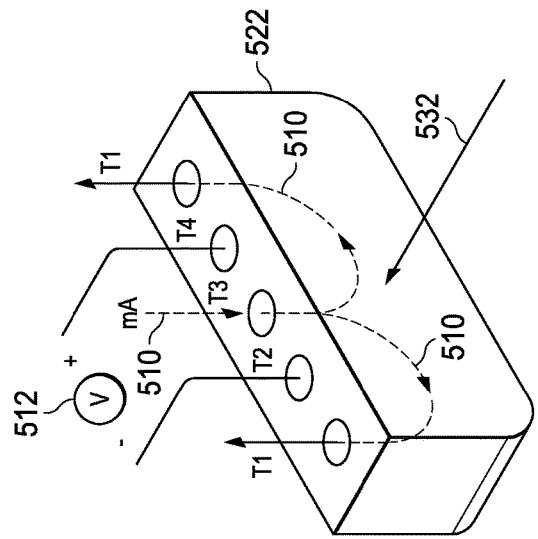
FIG. 5A
FIG. 5B

LINEAR HALL DEVICE BASED FIELD ORIENTED CONTROL MOTOR DRIVE SYSTEM

CROSS REFERENCE TO RELATED APPLICATION(S)

This continuation application claims priority to U.S. patent application Ser. No. 14/960,164, filed Dec. 4, 2015, which application is hereby incorporated herein by reference.

FIELD OF THE INVENTION

This disclosure relates motor drive systems, and in particular to motor drive system that uses perpendicularly arranged linear Hall devices.

BACKGROUND OF THE INVENTION

Brushless DC (direct current) electric motor (BLDC motors, BL motors) also known as electronically commutated motors (ECMs, EC motors) are synchronous motors that are powered by a DC electric source via an integrated inverter/switching power supply, which produces an AC (alternating current) electric signal to drive the motor. In this context, AC does not imply only a sinusoidal waveform, but rather a bi-directional current with no restriction on waveform. Additional sensors and electronics may control the inverter output amplitude and waveform in order to control DC bus usage/efficiency and frequency (i.e. rotor speed).

Digital motor control was first introduced to overcome the challenges that traditional analog systems had in handling drift, aging of components and variations caused by temperature. Flexible software algorithms not only eliminated tolerance issues relating to components, they enabled developers to dynamically accommodate variations in environmental conditions over time. For example, rather than only being able to turn a fan motor full on or off, fan speed can now be adjusted based on system temperature with a digital implementation. Additionally, systems may calibrate themselves, thus eliminating the need to schedule regular, manual maintenance.

Hall sensors are the industry choice for medium sensitivity magnetic sensors due to low cost, small area, and easy integrability. However, semiconductor Hall sensors may suffer from offset resulting from nonidealities such as mismatch, doping variations, and undesired piezoelectric effects. A technique referred to as "spinning current" may be used to reduce the offset.

The so called "Hall Effect" occurs when a magnetic field is oriented perpendicular to an electric current. The magnetic field generates a voltage difference across a conductor, called the Hall Voltage, in a direction which is perpendicular to both the direction of the magnetic field and the direction of the current flow. By measuring the Hall voltage it is possible to determine the magnitude of the magnetic field. Typical Hall sensors usually include a strip or plate of an electrically conductive material with an electric current flowing through the plate. When the plate is positioned in a magnetic field such that a component of the field is perpendicular to the plate, a Hall voltage is generated within the plate in a direction that is perpendicular to both the direction of the magnetic field and the direction of the current flow.

Semiconductor Hall effect sensors produced using current techniques typically include a sensing element produced from silicon. The magnetic sensitivity of these devices is directly related to the electron mobility, mu, of the material used to construct the sensing element. Silicon typically has an electron mobility of approximately 1500 $cm^2/(Vs)$.

BRIEF DESCRIPTION OF THE DRAWINGS

Particular embodiments in accordance with the invention will now be described, by way of example only, and with reference to the accompanying drawings:

FIGS. 5A, 5B, and 6 illustrate the operation of a vertical Hall effect device;

Figure 1A:
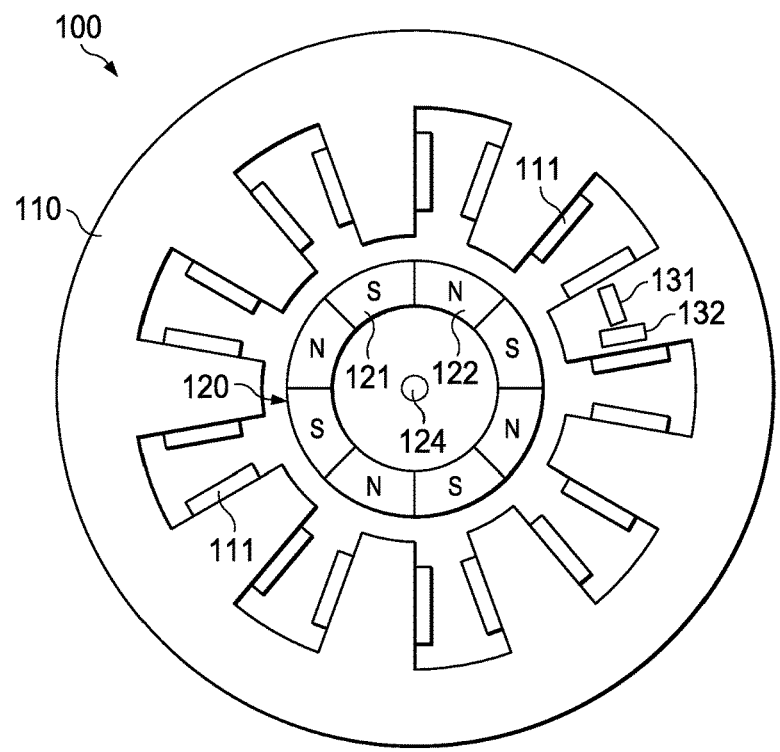
FIGS. 1A-1B are illustrations of an exemplary permanent magnet synchronous motor (PMSM)

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The permanent magnet synchronous motor (PMSM) can be thought of as a cross between an AC induction motor (ACIM) and a brushless DC motor (BLDC). They have rotor structures similar to BLDC motors which contain permanent magnets. However, their stator structure resembles that of its ACIM cousin, where the windings are constructed in such a way as to produce a sinusoidal flux density in the air gap of the machine. PMSM motors have the same winding structure as a BLDC motor but with a sinusoidal back EMF waveform, achieved by shaping the permanent magnets in the rotor structure.

However, unlike their ACIM relatives, PMSM motors perform poorly with open-loop scalar V/Hz control, since there is no rotor coil to provide mechanical damping in transient conditions. Field Oriented Control (FOC) is the most popular control technique used with PMSMs. As a result, torque ripple can be extremely low, on par with that of ACIMs. However, PMSM motors provide higher power density for their size compared to ACIMs. This benefit is because with an induction machine, part of the stator current is required to "induce" rotor current in order to produce rotor flux. These additional currents generate heat within the motor. However, the rotor flux is already established in a PMSM by the permanent magnets on the rotor.

Field-oriented motor drive systems have several well-known benefits, such as: maximize motor torque per amp; improved and simplified motor dynamics; and provide smoother torque production than trapezoidal drives. They fall into two categories: sensored and sensorless. "Sensorless" drive systems employ current and voltage measurements along with knowledge of motor parameters and a dynamic model to estimate the rotor electrical angle. "Sensored" drive systems rely on angular sensors such as optical encoders or resolvers to directly measure the shaft angle.

Sensorless FOC drive systems provide a compact solution; however, they may have startup and low speed issues. Initial position detection may be necessary because it is hard to distinguish between north and south poles. Therefore, significant processing may be required.

Sensored FOC drive systems have a high startup reliability and provide good torque production at low speed. Better velocity control at low speeds relative to the rated speed is possible. However, an angular sensor is required. In the past, angular sensors have been delicate and expensive. For example, an optical encoder may cost more than $50. A sensored FOC system with an angular encoder may require more space than a sensorless system and require more wires and components.

The general concept of digital motor control is well known; see e.g. "Designing High-Performance and Power-Efficient Motor Control Systems", Brett Novak et al., June 2009, which is incorporated by reference herein.

The general concept of integrated motor controllers is well known; see, e.g. "Increased integration, improved feature sets and new software for motor control systems: C2000™ Piccolo™ F2805x microcontrollers", Patrick Carner, November 2012, which is incorporated by reference herein.

Embodiments of the present disclosure may provide an integrated sensored FOC system in which space and cost are minimized, as will be described in more detail below.

FIG. 1A is an illustration of an exemplary permanent magnet synchronous motor (PMSM) 100. In this example, a rotor 120 is configured to rotate a shaft 124 within a stator 110. Stator 110 includes a set of coils, as indicated at 111. Rotor 120 includes a set of permanent magnets, such as south (S) polarity magnet 121 and north (N) polarity magnet 122.

Most PMSMs utilize permanent magnets, such as magnets 121, 122, that are mounted on the surface of the rotor. This configuration makes the motor appear magnetically "round", and the motor torque is the result of the reactive force between the magnets on the rotor and the electromagnets of the stator formed by coils 111. This configuration results in the optimum torque angle being 90 degrees, which may be obtained by regulating the d-axis current to zero in a typical FOC application.

Figure 1B:
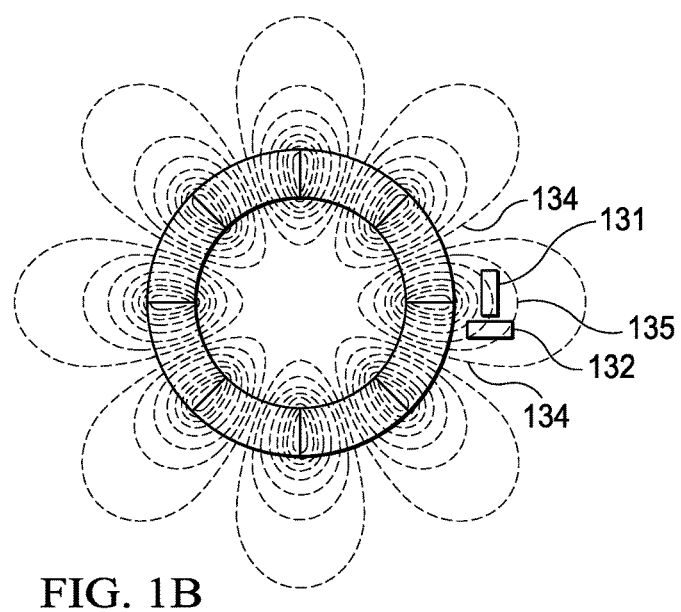

FIG. 1B illustrates an exemplary magnetic field that may be produced by the rotor magnets 121, 122 of rotor 120. The tangential field will be strongest between the magnets, as illustrated at 135, and weakest at the center of each magnet. The radial field will be the strongest at the center of each magnet, as illustrated at 134, and weakest between the magnets. An axial field component (not shown) may extend parallel to the axis of rotation of the rotor.

Basically, there are two kinds of Hall effect sensors. One type is a "linear" device, which means the output of voltage linearly depends on magnetic flux density. The other type is referred to as a "threshold" device, or a "digital" device, which means there will be a sharp decrease of output voltage at a threshold magnetic flux density. Linear Hall sensors are utilized herein to produce signals that are proportional to the pending magnetic flux.

Linear Hall devices 131, 132 may be co-located adjacent to each other to sense the radial and tangential magnetic fields produced by the permanent magnets on rotor 120. In some embodiments, Hall devices 131, 132 may each be packaged in a separate module. In this case, they should be located close to each other so that they are sensing the tangential and radial field strength in roughly the same location in order to simplify signal interpretation. They should also be placed perpendicular to each other in order to accurately sense the tangential and radial magnetic flux. This configuration of two perpendicularly positioned Hall devices is referred to as "two dimensional" (2D) herein.

In some embodiments, both Hall devices may be fabricated on a same integrated circuit die. In this manner, they will be located close together on the same die. A horizontal Hall device and a vertical Hall device may be formed in order to create a perpendicular relationship between the two Hall devices.

In another embodiment, the two Hall devices may be configured so that one Hall device is sensitive to radial magnetic flux while the other Hall device is sensitive to axial magnetic flux, i.e. flux that is approximately parallel to the axis of rotor 120.

Figure 2:
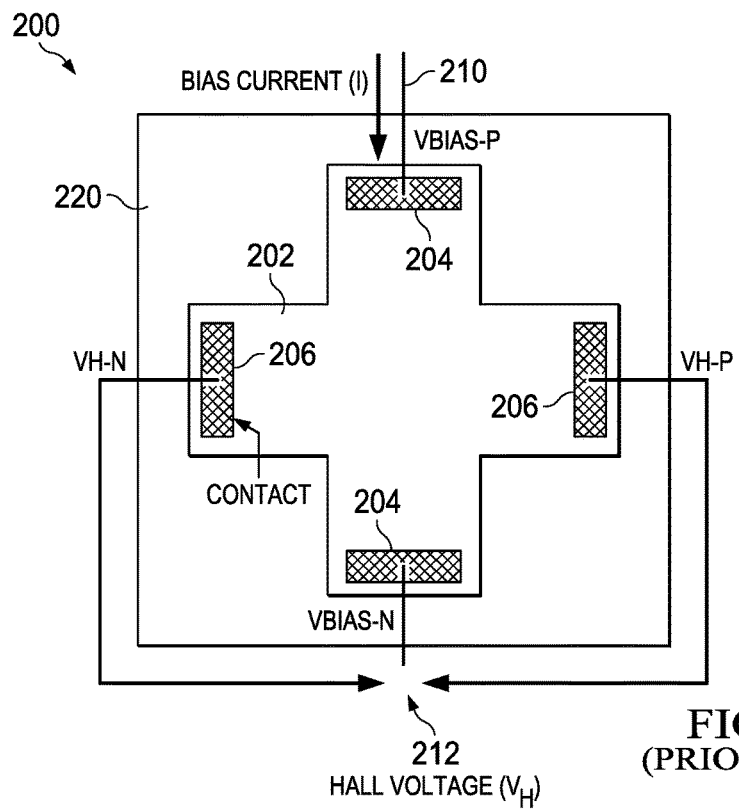
FIGS. 2-4 illustrate the operation of a conventional horizontal Hall effect device.
Figure 3:
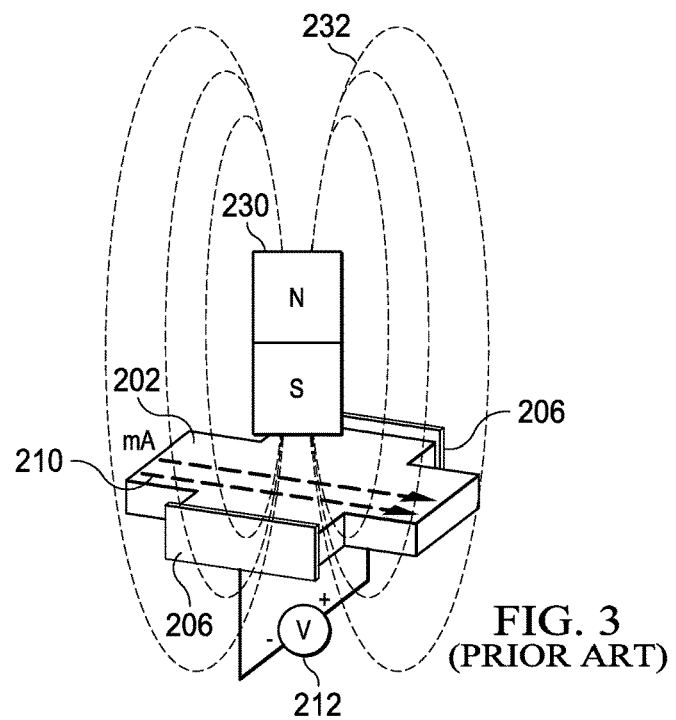

FIG. 2 is an illustration of an exemplary horizontal Hall sensor (HS) device 200. FIG. 3 is an isometric view of HS 200. The general concept of Hall sensor is well known and need not be described in detail herein. As mentioned above, the "Hall Effect" occurs when a magnetic field is oriented perpendicular to an electric current. The magnetic field generates a voltage difference across a conductor, called the Hall Voltage, in a direction which is perpendicular to both the direction of the magnetic field and the direction of the current flow. By measuring the Hall voltage, it is possible to determine the magnitude of the magnetic field.

In this example, Hall sensor element 202 may be fabricated on a substrate 220 using known or later developed fabrication techniques. The key factor determining sensitivity of Hall Effect sensors is high electron mobility. The following materials are especially suitable for Hall Effect sensors: gallium arsenide (GaAs), indium arsenide, (InAs) indium phosphide (InP), indium antimonide (InSb), graphene, etc.

Contact regions 204, 206 are formed in contact with element layer 202 in order to provide a bias current 210 through the Hall element layer and to sense a resulting Hall Effect voltage 212.

Hall element 202 may be patterned into a traditional cross shape, as illustrated in FIG. 2. In other embodiments, other element shapes may be patterned, such as an octagon or substantially octagonal, a triangle or substantially triangular, a quatrefoil or substantially quatrefoil shaped, a circle or substantially circular shape, etc. Similarly, depending on the geometry of element layer 202, the number of contact pads 204, 206 and corresponding wires may be altered to fit a given application.

In this example, Hall voltage 212 may be represented by expression (1).

$$V_{Hall} = \frac{I_{bias}B_Z}{nte} \quad (1)$$

where:

$I_{bias}$=the current across the shape
$B_z$=the magnetic field normal to the shape
n=is the charge carrier density
t=thickness of the Hall element
e=the elementary charge This design results in a sensitivity of approximately 300 V/AT (volts/amp*Tesla). For example, a Hall voltage of approximately 30 uV will be produced with a bias current of 100 uA in a 1 mT field. The channel resistance may be approximately 5.7 k ohms.

FIG. 3 illustrates a magnet 230 positioned above Hall element 202 in a typical sensing configuration. Flux lines 232 from magnet 230 that penetrate Hall element 202 in a perpendicular or somewhat perpendicular manner with respect to the flow of bias current 210 produce a Hall effect voltage 212 that is formed across contacts 206.

Figure 4:
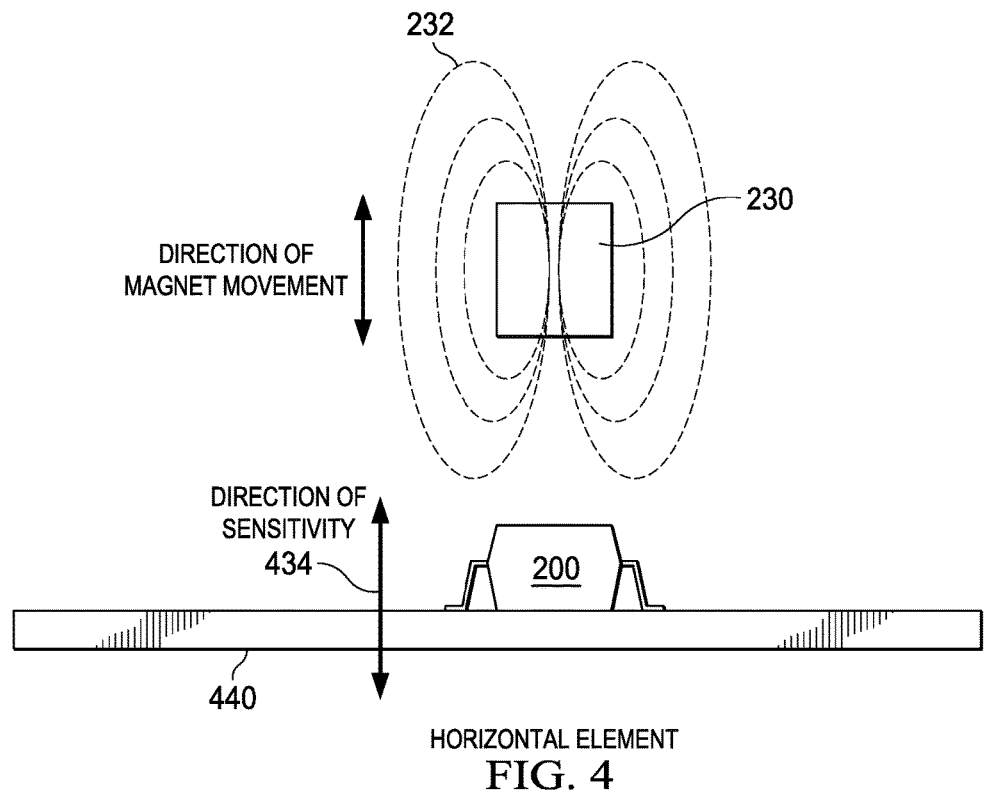

FIG. 4 is an illustration of horizontal Hall device 200 that is packaged in a typical surface mount package mounted on a substrate 440. Substrate 440 may be a rigid or flexible printed circuit board, for example. The substrate may be any commonly used or later developed material used for electronic systems and packages, such as: silicon, ceramic, Plexiglas, fiberglass, plastic, metal, etc., for example. Hall device 200 is referred to as a "horizontal" device because the Hall element is position parallel to substrate 440; this orientation makes it sensitive to magnetic flux 232 from a magnet 230 that is moving in a direction perpendicular 434 to substrate 440.

FIG. 5A, 5B are cross sectional views of an exemplary vertical Hall device 500 that is formed in a p-type semiconductor substrate 520. A deep nwell (dnwell) 522 may be formed in substrate 520 using known diffusion techniques. A shallow pwell (spwell) 524 may be formed around dnwell 522 for isolation using known diffusion techniques. Contacts 504, 505, 506 may be formed by diffusion in dnwell 522. Bias current 510 may be injected into dnwell 522 via contact 504 and return bias current 511 may be collected via contacts 505. A Hall voltage 512 may be formed across contacts 506 in response to a magnetic field applied to dnwell 522.

FIG. 5B illustrates how bias current 510 flows through dnwell 522. Vertical Hall device 500 is most sensitive to magnetic flux 532 that is perpendicular to dnwell 522 and therefore in the plane of substrate 520.

Figure 6:
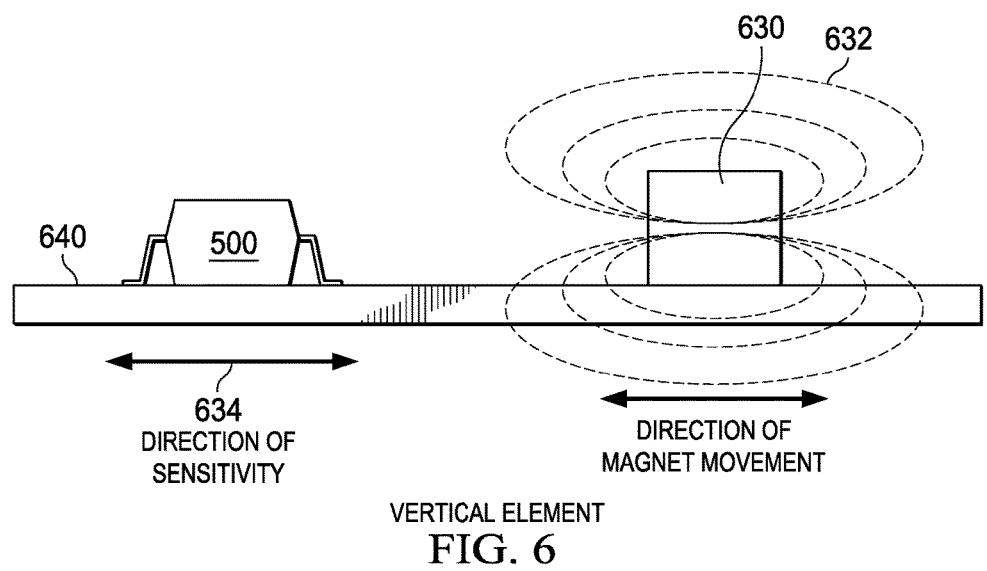

FIG. 6 is an illustration of vertical Hall device 500 that is packaged in a typical surface mount package mounted on a substrate 640. Substrate 640 may be a rigid or flexible printed circuit board, for example. The substrate may be any commonly used or later developed material used for electronic systems and packages, such as: silicon, ceramic, Plexiglas, fiberglass, plastic, metal, etc., for example. Hall device 500 is referred to as a "vertical" device because the Hall element 522 is perpendicular to substrate 640. It is sensitive to magnetic flux 632 from a magnet 630 that is moving in a direction parallel 634 to substrate 640.

FIGS. 7A-7D illustrate the results of processing signals provided by a vertical Hall device, such as vertical Hall device 500, and a horizontal Hall device, such as horizontal Hall device 200, in an exemplary PMSM, such as PMSM 100. In general, vertical Hall devices have a lower sensitivity than horizontal Hall devices. They also have a higher residual offset as compared to a horizontal Hall device.

Figure 7A:
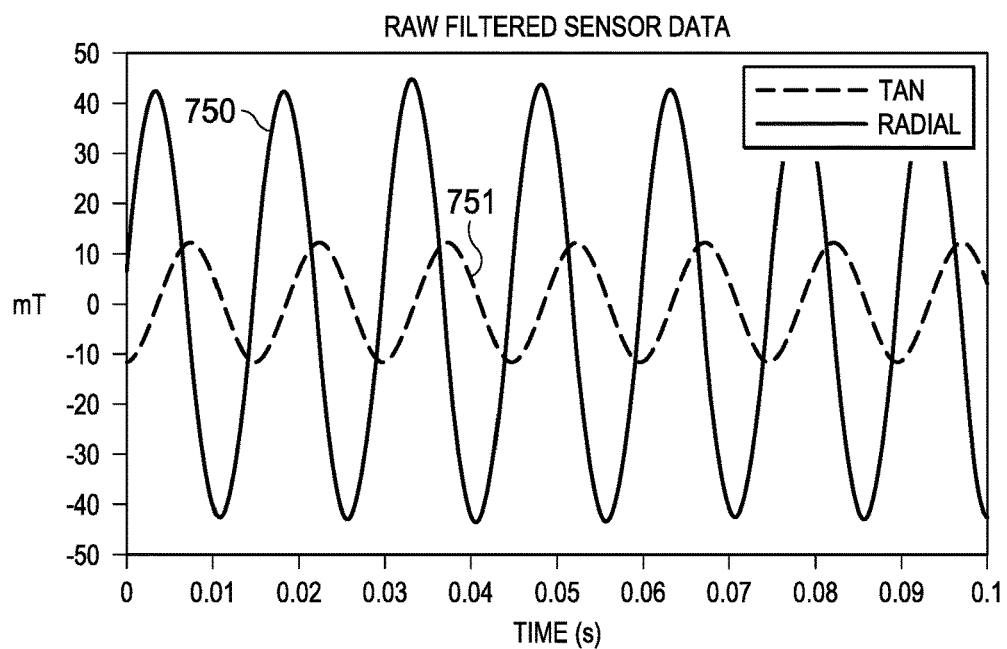
FIGS. 7A-7D illustrate the results of processing signals provided by a vertical and a horizontal Hall device in an exemplary PMSM.

Referring to FIG. 7A, plot line 750 illustrates raw low pass filtered sensor data from a linear horizontal Hall device that is aligned to be sensitive to radial magnetic flux produced by the rotor magnets 121, 122 of rotor 120, referring back to FIG. 1A. Similarly, plot line 751 illustrates raw filtered sensor data from a linear vertical Hall device that is aligned to be sensitive to tangential magnetic flux produced by the rotor magnets 121, 122 of rotor 120. In both cases, the plot lines represent magnetic flux strength in milliTeslas (mT) vs. time as rotor 120 rotates through several electrical cycles. In this example, two horizontal Hall sensors, which are oriented 90° with respect to one another, are used. Both sensors have the same sensitivity (V/mT). The graphs indicate that the tangential magnetic field is weaker.

In another example in which a 2D Hall sensor is used, it would be appropriate to align it such that the vertical Hall sensor picks up the radial field and the horizontal Hall sensor picks up the tangential field, since a horizontal Hall sensor is typically more sensitive than a veridical Hall sensor.

Figure 7B:
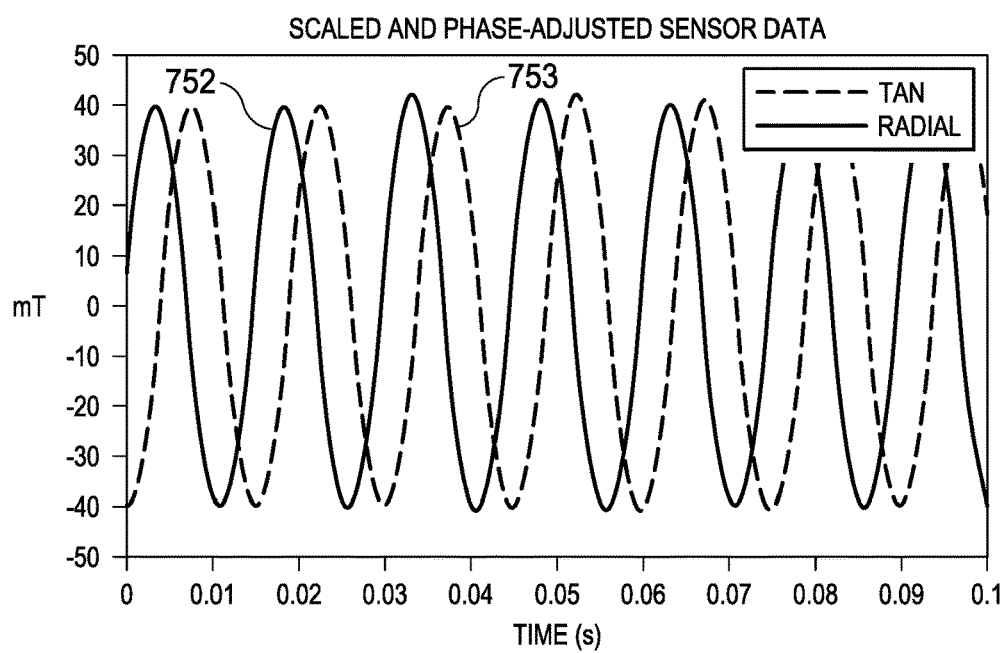

FIG. 7B illustrates the result of applying a gain to the radial magnetic plot 750 and a gain to the tangential magnetic plot 751 to make the amplitude of the gain-adjusted radial plot 752 equal to the amplitude of the gain-adjusted tangential plot 753.

Figure 7C:
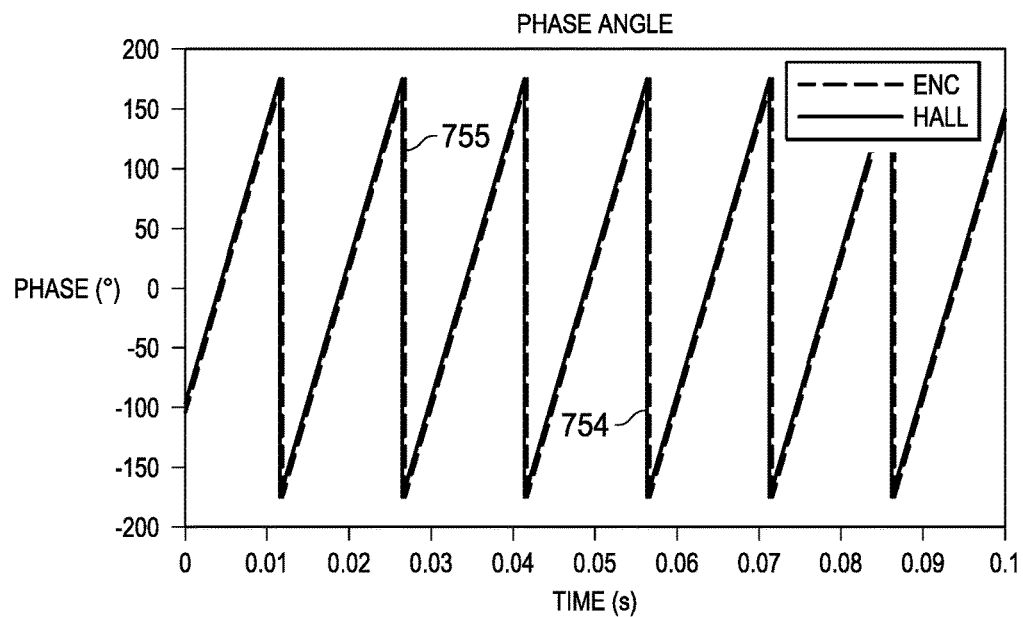

FIG. 7C illustrates the result of computing angular position (Phase) vs. time for a given rotation speed of rotor 120 using the gain adjusted Hall sensor data, as shown by plot line 754. Similarly, plot line 755 illustrates the result of computing angular position of rotor 120 using data obtained from an optical encoder. The angular position may be computed from the sensor data using known or later developed algorithms. For example, the angle may be determined based on the two field strength signals by either calculating a four quadrant arc tangent directly or using a non-linear observer to compute the angle indirectly. Computation of an electrical angle directly using four quad arctan is illustrated by expression (2).

$$\theta_e = \arctan (Hr, Ht) \quad (2)$$

where:
Hr is the radial field strength
Ht is the tangential field strength

Figure 12:
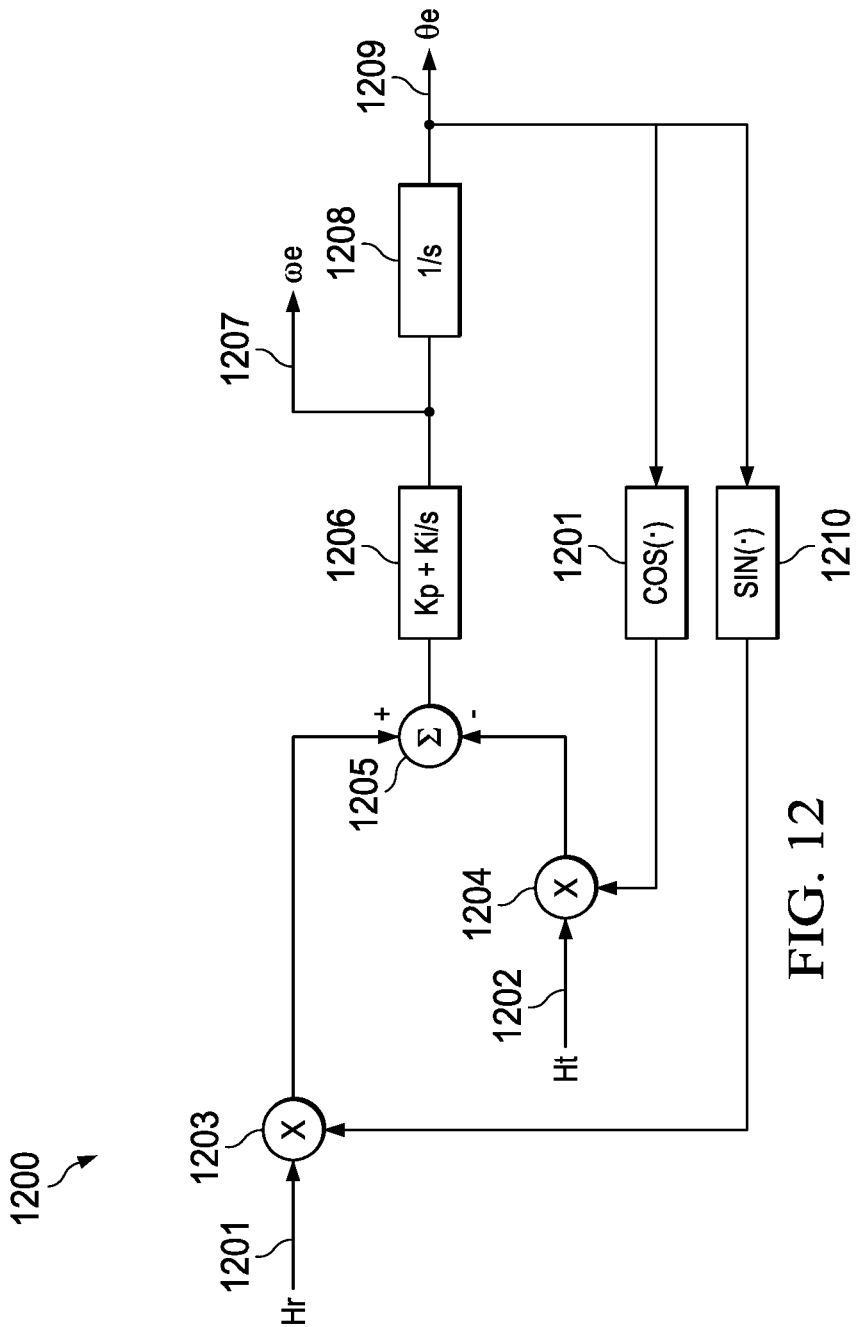
FIG. 12 illustrates a process for calculating speed and angle using a non-linear observer.

FIG. 12 illustrates a process for calculating speed and angle using a non-linear observer. The four quad arctan method is more sensitive to noise measurement and harmonics in the sensed radial and tangential magnetic signals. The non-linear observer process includes an integrator that acts as a filter. In this example, the radial field strength signal 1201 is scaled by the output of cosine function 1211 while the tangential field strength signal 1202 is scaled by the output of sin function 1210 and then combined in summer 1205. Function 1206 sums the scaled input, where the input has been multiplied by a proportional gain Kp, and the scaled integral of the input, where the input has been integrated and multiplied by a integrational gain Ki. Function 1208 integrates the input to translate from angular speed to angular position.

Referring again to FIG. 7C, notice that there is essentially no difference between the low cost Hall sensor results and the expensive optical sensor results.

Figure 7D:
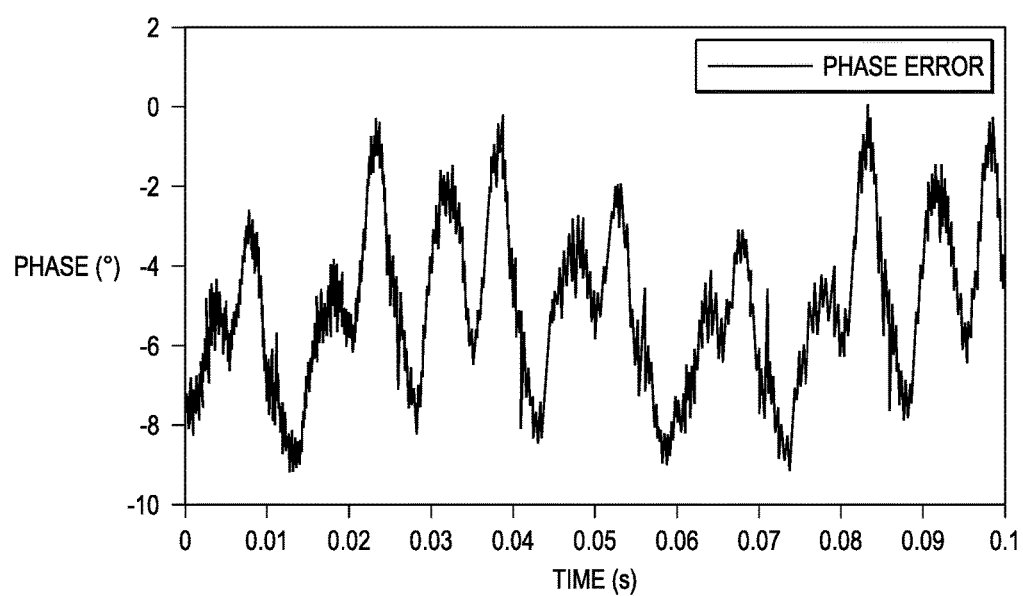

FIG. 7D illustrates phase error over time. In a FOC control system, torque "loss" is proportional to 1-cos(θ_err), where θ_err is the angular measurement error. Assuming the DC error can be corrected (it's due to mechanical misalignment), the error is equivalent to a torque loss of less than 1 percent.

Figure 8:
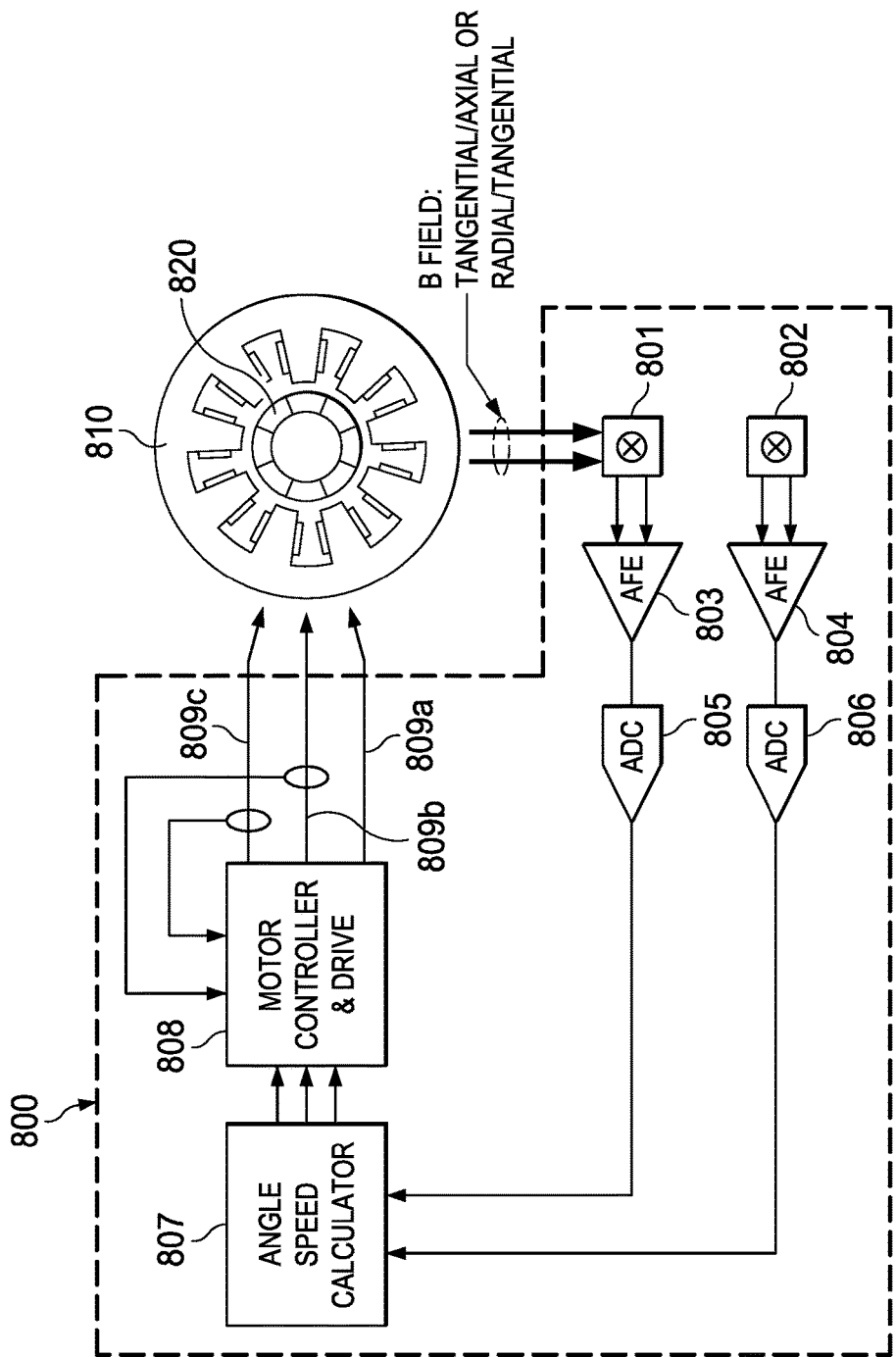
FIG. 8 is a block diagram of a complete motor control system using perpendicular linear Hall sensors.

FIG. 8 is a block diagram of a complete motor control system 800 using two linear Hall sensors 801, 802. A PMSM that has a stator 810 with field windings and a rotor 820 that has a plurality of permanent magnets may be controlled by motor control system 800.

As described above in more detail, one linear Hall device 801 may be placed adjacent rotor 820 in order to detect the radial magnetic field produced by the rotor magnets of rotor 820. Similarly, a second linear Hall device 802 may be placed adjacent rotor 820 and in proximity to Hall device 801 in order to detect the axial or tangential magnetic field produced by the rotor magnets of rotor 820. As described above in more detail, these two linear Hall sensors are co-located perpendicular to each other in order to sense two orthogonal components of the magnetic field produced by the rotor magnets of rotor 820 as it rotates, or while it is stationary.

Analog front ends (AFE) 803, 804 are connected to receive and buffer the sensor data from the two Hall devices. The buffered sensor data is then provided to analog to digital converters (ADC) 805, 806 to produce a sample digital stream that represents the strength of the orthogonal magnetic field components.

Angle and speed calculation logic 807 may then process the digital streams to calculate the instantaneous angular position and the instantaneous rotational velocity based on the change of angular position using known or later developed algorithms. For example, the angle may be determined based on the two field strength signals by either calculating a four quadrant arc tangent directly or using a non-linear observer to compute the angle indirectly, as described in more detail above.

Motor controller and drive logic 808 may then generate phase signals 809a-809c for the field windings in stator 810. Known or later developed techniques may be used to produce the phase signals. For example, the well known Clarke and Park transforms may be used. Through the use of the Clarke transform, the direct (Id) and quadrature (Iq) currents can be identified. The Park transform can be used to realize the transformation of the Id and the Iq currents from the stationary reference frame to the moving reference frame and control the spatial relationship between the stator vector current and rotor flux vector. The operation of Park and Clarke transforms are described in more detail in "Clarke & Park Transforms on the TMS320C2xx", Texas Instruments, BPRA048, 1997, which is incorporated by reference herein.

In some embodiments, linear Hall devices 801, 802 may be packaged in separate packages. AFE 803, 804, ADC 805, 806, angle logic 807 and control logic 808 may all be provided in a single integrated circuit, such as a C2000™ Piccolo™ F2805x microcontroller device available from Texas Instruments.

In another embodiment, linear Hall devices 801, 802, AFE 803, 804, ADC 805, 806, angle logic 807 and control logic 808 may all be provided in a single integrated circuit such that an entire FOC motor control and drive system is provided in a single integrated circuit.

Figure 9:
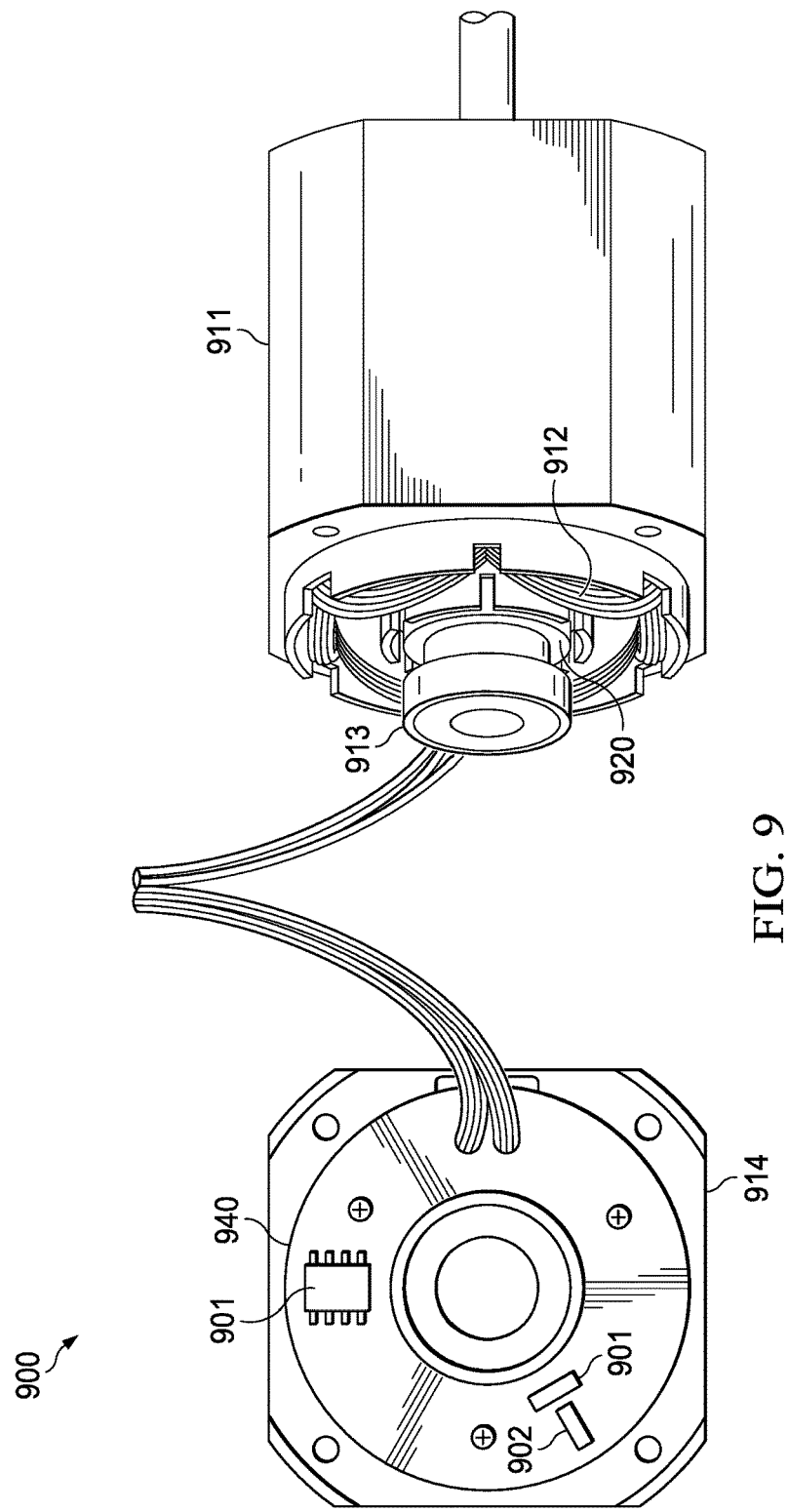
FIG. 9 is an illustration of placement of 2D linear Hall sensors in an exemplary PMSM.

FIG. 9 is an illustration of placement of two linear Hall sensors 901, 902 in a 2D array in an exemplary PMSM 900. Motor housing 911 surrounds a stator that includes field windings 912. A rotor 920 is configured to rotate within housing 911. An end cap 914 is configured to mate with motor housing 911. End cap 914 includes a bearing support to mate with rotor bearing 913.

A printed circuit board 940 is mounted on end cap 914. Motor controller 901 is mounted on substrate 940 and includes buffers, ADCs, angle/speed logic, and control/drive logic described in more detail with regard to FIG. 8. Linear Hall devices 901, 902 are mounted on substrate 940 in a position that will place them close to rotor 920 during normal operation of PMSM 900. Linear Hall device 901 may be positioned to be sensitive to radial magnetic flux produced by the rotor magnets of rotor 920, while linear Hall device 902 may be positioned perpendicular to Hall device 901 in order to be sensitive to tangential magnetic flux produced by rotor magnets of rotor 920.

In another embodiment, linear Hall devices 901 and 902 may be fabricated within a same integrated circuit that includes all of the control and drive logic 901 required to control PMSM 900. In this manner, a single integrated microcontroller may be used to sense magnetic flux produced by the rotor magnets of rotor 920 in order to accurately determine rotor speed and position and to generate the phase signals provided to field windings 912 of PMSM 900.

In a another embodiment, instead of measuring the radial and tangential fields, a pair of perpendicularly arranged Hall sensors may be used to measure the axial and tangential end fields at the end of the rotor. From an assembly point of view, this configuration may be more convenient. If a surface mount package containing both Hall sensors is used, a horizontal and vertical sensor would be required as before.

Figure 10:
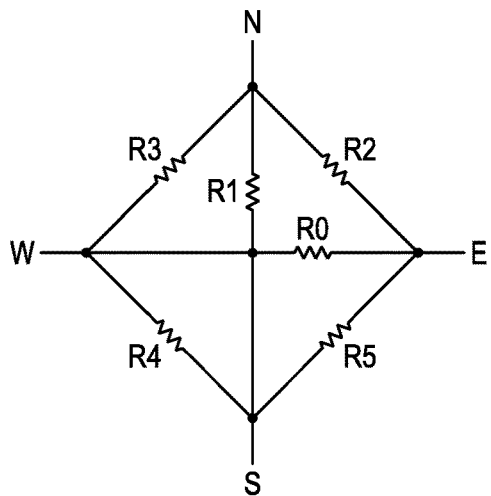
FIG. 10 is a schematic illustrating an electrical equivalent of a Hall device.

FIG. 10 is a schematic illustrating an electrical equivalent of a Hall device, such as horizontal Hall device 200 or vertical Hall device 500. In this model, assume the bias current is injected at port N and removed at port S, and the Hall voltage is measured across ports W and E. There is an effective channel resistance R1 to the bias current and a channel resistance R0 in the Hall voltage path. There is also a Wheatstone bridge resistance effect represented by resistors R2-R5. There is typically a large offset due to resistor mismatch in the Wheatstone bridge type electrical model that is unavoidable even with the state-of-the-art lithography and fabrication processes. Each and all of these resistance effects may vary over time and temperature to contribute to the offset voltage drift.

A bias current compensation technique referred to as "spinning current" may be used to at least partially reduce the offset. In this technique, the bias current is provided sequentially to at least two different pairs of contacts N, S, E, W on the Hall element. Superposition of the supplied currents results in a continuously spinning current vector in the Hall device. By simultaneously measuring the voltages between corresponding terminals, a signal containing the Hall voltage and a periodic offset voltage can be isolated. The offset voltage may be eliminated by averaging the signal over at least one period.

Figure 11:
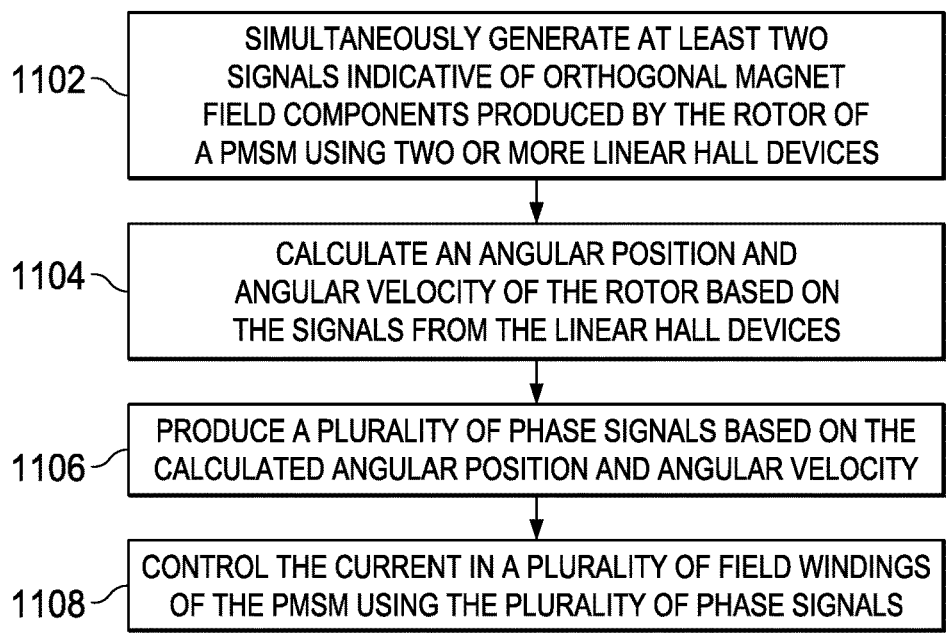
FIG. 11 is a flow diagram illustrating operation of linear Hall device based field oriented control motor drive system.

FIG. 11 is a flow diagram illustrating operation of a linear Hall device based field oriented control motor drive system. Referring back to FIG. 1, the rotor magnets of a PMSM, such as PMSM 100, may produce a magnetic field that has radial, axial, and tangential components, depending on the sampling point of reference. During operation of PMSM 100, at least two signals indicative of orthogonal magnet field components produced by the rotor of PMSM 100 are generated 1102 using two or more perpendicular linear Hall devices. For example, a first linear Hall device may produce a first signal indicative of a strength of a first magnetic field component produced by the rotor magnets included within a rotor of the electric motor 100 while a second linear Hall device may simultaneously produce a second signal indicative of a strength of second magnetic field component produced by the rotor magnets that is approximately orthogonal to the first magnetic field component. One of the magnetic field components may be a radial component, while the second magnetic component may be a tangential or an axial component, for example.

An angular position and angular velocity of the rotor may be calculated 1104 based on the signals from the linear Hall devices using known or later developed algorithms.

A plurality of phase signals may then be produced 1106 based on the calculated angular position and angular velocity using known or later developed algorithms.

The current in a plurality of field windings of the motor may then be controlled 1108 using the plurality of phase signals using known or later developed algorithms. For example, Clarke and Park transforms may be used to produce a set of pulse width modulated signals that may be combined to form phase signals for the field windings that are sinusoidal, trapezoidal, etc.

In this manner, an accurate and low cost field oriented control motor drive system may be provided in a single integrated circuit package that does not require any additional sensor devices or auxiliary sensing magnets.

Other Embodiments

While the invention has been described with reference to illustrative embodiments, this description is not intended to be construed in a limiting sense. Various other embodiments of the invention will be apparent to persons skilled in the art upon reference to this description. For example, while a cross shaped device is illustrated herein, other element shapes may be patterned, such as an octagon or substantially octagonal, a triangle or substantially triangular, a quatrefoil or substantially quatrefoil shaped, a circle or substantially circular shape, etc. Similarly, depending on the geometry of Hall element layer, the number of contact pads and corresponding wires may be altered to fit a given application.

In some embodiments, the linear Hall devices may be packaged in separate packages. In some embodiments, the linear Hall devices and all of the buffering and processing logic may be packaged in a single integrated circuit.

While a two dimensional array of two perpendicular Hall devices was described herein, other embodiments may include more than two Hall devices. For example, three Hall devices may be used to sense tangential, radial, and axial magnetic flux components.

While an exemplary PMSM was described herein, other embodiments of the disclosure may be use to control other motor configurations, such as one in which the rotor surrounds the field windings. Other embodiments may be used to control "pancake" style motors, etc.

The techniques described in this disclosure may be implemented in hardware, software, firmware, or any combination thereof. For example, the angular position and speed determination process may be performed in software. Similarly, the motor control processing may be performed in software. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for controlling an electric motor, the method comprising:
    simultaneously producing: using a first linear Hall device, a first signal indicative of a strength of a first magnetic field component produced by a set of rotor magnets within a rotor of the electric motor; and, using a second linear Hall device, a second signal indicative of a strength of a second magnetic field component produced by the set of rotor magnets that is approximately orthogonal to the first magnetic field component;
    normalizing the first and second signals to produce first and second normalized signals;
    calculating an angular position and angular velocity of the rotor based on the first normalized signal and the second normalized signal;
    producing a plurality of phase signals based on the calculated angular position and angular velocity; and
    controlling current in a plurality of field windings of the electric motor using the plurality of phase signals.

2. The method of claim 1, in which the first linear Hall device is located adjacent the rotor, and in which the second linear Hall device is positioned perpendicular to the first linear Hall device.

3. A motor drive system comprising:
    a multidimensional Hall device array including at least a first linear Hall device and a second linear Hall device, the first linear Hall device having a first output, the second linear Hall device having a second output, the first linear Hall device configured to produce a first signal at the first output indicative of magnetic field strength, and the second linear Hall device configured to produce a second signal at the second output indicative of the magnetic field strength, wherein the first Hall device is configured to receive a first bias compensation current to remove an offset from the first signal, and the second Hall device is configured to receive a second bias compensation current to remove an offset from the second signal;

angle-speed calculation logic having an angle-speed output, a first input coupled to the first output, and a second input coupled to the second output, the angle-speed calculation logic configured to produce angular speed information at the angle-speed output based on the first and second signals; and motor controller and drive logic having an input coupled to the angle-speed output, and having motor control outputs adapted to be coupled to a motor, the motor controller and drive logic configured to provide a plurality of phase signals at the motor control outputs based on the angular speed information.

4. The system of claim 3, in which the second linear Hall device is positioned perpendicular to the first linear Hall device.

5. The system of claim 3, in which the multidimensional Hall device array, the angle-speed calculation logic and the motor controller and drive logic are all formed on a single integrated circuit (IC).

6. A permanent magnet synchronous motor (PMSM) comprising:

a stator having a plurality of phase inputs and field windings coupled to the phase inputs, the stator configured to receive phase signals at the phase inputs, and the field windings configured to conduct current based on the phase signals;

a rotor configured to rotate with reference to the stator, the rotor having a plurality of rotor magnets configured to produce a magnetic field based on the conducted current; and a motor drive system positioned so as to be within the magnetic field, the motor drive system including a first linear Hall device and a second linear Hall device positioned perpendicular to each other;

wherein the first linear Hall device and the second linear Hall device are provided on a single integrated circuit (IC).

7. The PMSM of claim 6, in which the first linear Hall device has a first output, the second linear Hall device has a second output, the first linear Hall device is configured to produce a first signal at the first output indicative of magnetic field strength, the second linear Hall device is configured to produce a second signal at the second output indicative of the magnetic field strength, and the motor drive system includes:

angle-speed calculation logic having an angle-speed output, a first input coupled to the first output, and a second input coupled to the second output, the angle-speed calculation logic configured to produce angular speed information at the angle-speed output based on the first and second signals; and motor controller and drive logic having an input coupled to the angle-speed output, and having motor control outputs coupled to the phase inputs, the motor controller and drive logic configured to provide the phase signals at the motor control outputs based on the angular speed information.

8. The PMSM of claim 7, in which the first linear Hall device, the second linear Hall device, the angle-speed calculation logic and the motor controller and drive logic are all formed on the single integrated circuit (IC).

\* \* \* \* \*